United States Patent
Kimura

(10) Patent No.: US 11,120,842 B2
(45) Date of Patent: Sep. 14, 2021

(54) MEMORY SYSTEM HAVING PLURAL CIRCUITS SEPARATELY DISPOSED FROM MEMORIES

(71) Applicant: KIOXIA CORPORATION, Tokyo (JP)

(72) Inventor: Fuminori Kimura, Kamakura Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/806,997

(22) Filed: Mar. 2, 2020

(65) Prior Publication Data

US 2021/0082474 A1 Mar. 18, 2021

(30) Foreign Application Priority Data

Sep. 13, 2019 (JP) .............................. JP2019-167005

(51) Int. Cl.
| | |
|---|---|
| *G11C 5/06* | (2006.01) |
| *H01L 25/18* | (2006.01) |
| *G11C 5/02* | (2006.01) |
| *G11C 11/409* | (2006.01) |
| *G11C 16/04* | (2006.01) |

(52) U.S. Cl.
CPC .............. *G11C 5/06* (2013.01); *G11C 5/025* (2013.01); *G11C 11/409* (2013.01); *H01L 25/18* (2013.01); *G11C 16/0483* (2013.01)

(58) Field of Classification Search
CPC ......... G11C 5/06; G11C 5/025; G11C 11/409; G11C 16/0483; H01L 25/18
See application file for complete search history.

(56) References Cited

U.S. PATENT DOCUMENTS

| | | | | |
|---|---|---|---|---|
| 6,125,419 | A * | 9/2000 | Umemura | G06F 13/4086 710/110 |
| 6,308,232 | B1 * | 10/2001 | Gasbarro | G06F 13/4086 326/30 |
| 8,080,874 | B1 * | 12/2011 | Werner | H05K 1/181 257/723 |
| 8,274,308 | B2 | 9/2012 | McCall et al. | |
| 10,108,563 | B2 | 10/2018 | Yun et al. | |
| 10,236,032 | B2 * | 3/2019 | Oh | G11C 7/1003 |
| 2009/0103373 | A1 * | 4/2009 | Shau | G11C 7/1066 365/189.02 |

FOREIGN PATENT DOCUMENTS

JP 2008-46797 A 2/2008

* cited by examiner

*Primary Examiner* — Vanthu T Nguyen
(74) *Attorney, Agent, or Firm* — Kim & Stewart LLP

(57) ABSTRACT

A memory system includes a first substrate including a first signal terminal and a second signal terminal electrically connected to a bus, a first circuit in which a first switching element and a first resistor are connected in series between a first terminal and a second terminal, the first terminal connected to the first signal terminal, a second circuit in which a second switching element and a second resistor are connected in series between a third terminal and a fourth terminal, the third terminal connected to the second signal terminal, a first memory electrically connected to the second terminal, a second memory electrically connected to the fourth terminal, and a controller electrically connected to the bus and configured to control the first and second switching elements.

20 Claims, 13 Drawing Sheets

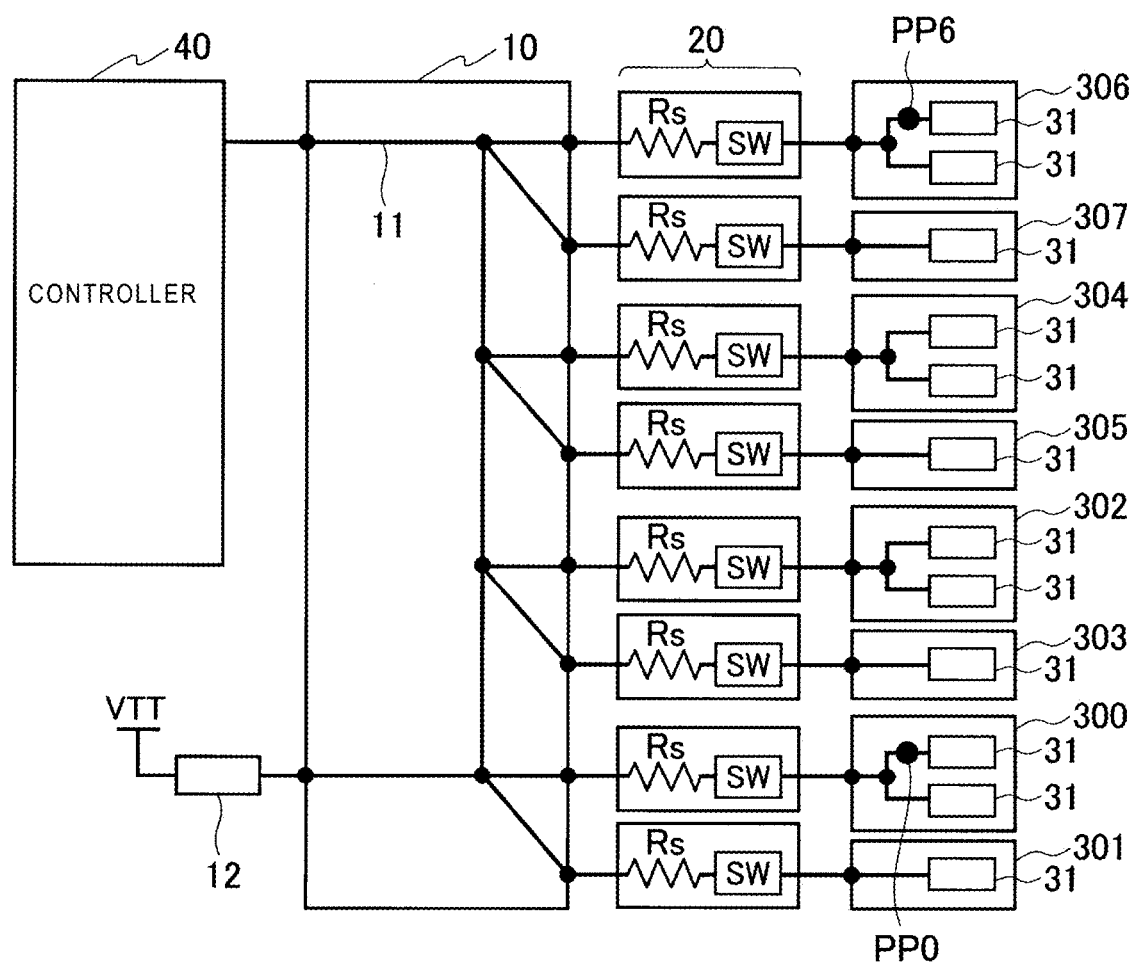

MEMORY SYSTEM HAVING PLURAL CIRCUITS SEPARATELY DISPOSED FROM MEMORIES

CROSS-REFERENCE TO RELATED APPLICATION(S)

This application is based upon and claims the benefit of priority from Japanese Patent Application No. 2019-167005, filed Sep. 13, 2019, the entire contents of which are incorporated herein by reference.

FIELD

Embodiments described herein relate generally to a memory system including a plurality of memories connected to a bus.

BACKGROUND

A solid state drive (SSD) is used as a memory system that includes a memory such as a synchronous dynamic random access memory (SDRAM). In the memory system such as the SSD, a memory controller and the memory are mounted on a substrate, and various signals are transmitted and received between the memory controller and the memory via a bus formed in the substrate.

At this time, when a load capacity of the memory connected to the bus is unbalanced, a quality of a signal waveform of the bus deteriorates due to reflection of a signal from a terminal of the memory. When the quality of the signal waveform of the bus deteriorates, the memory system cannot be operated at a high speed.

Therefore, a countermeasure for preventing the reflection of the signal by inserting a series resistor between the bus and the memory (i.e., stub series termination logic (SSTL)) has been studied. However, it is difficult to ensure a space for these components on a plane of the substrate on which the memory is mounted.

DESCRIPTION OF THE DRAWINGS

FIG. 7 is a circuit configuration diagram of the memory system according to the first embodiment.

DETAILED DESCRIPTION

Figure 1:
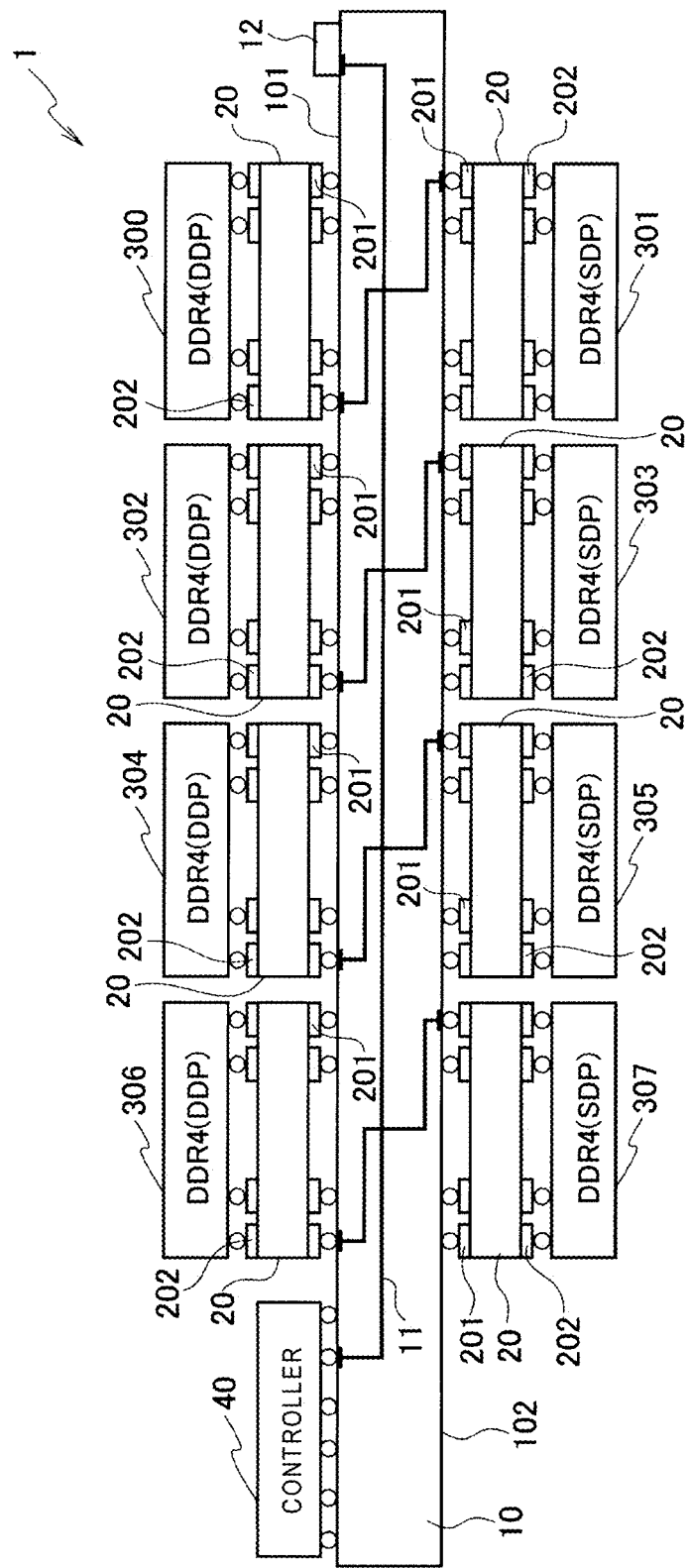
FIG. 1 is a schematic view showing a configuration of a memory system according to a first embodiment.

Embodiments provide a memory system that can prevent deterioration in a quality of a signal waveform on a bus caused by reflection of a signal.

In general, according to one embodiment, a memory system includes a first substrate including a first signal terminal and a second signal terminal electrically connected to a bus, a first circuit in which a first switching element and a first resistor are connected in series between a first terminal and a second terminal, the first terminal connected to the first signal terminal, a second circuit in which a second switching element and a second resistor are connected in series between a third terminal and a fourth terminal, the third terminal connected to the second signal terminal, a first memory electrically connected to the second terminal, a second memory electrically connected to the fourth terminal, and a controller electrically connected to the bus and configured to control the first and second switching elements.

Embodiments will be described below with reference to the accompanying drawings. In description of the drawings, the same components are denoted by the same reference numerals, and description thereof is omitted.

First Embodiment

FIG. 1 is a schematic view showing a configuration of a memory system 1 according to a first embodiment. As shown in FIG. 1, the memory system 1 according to the first embodiment includes a first substrate 10 in which a bus 11 is formed, a plurality of second substrate portions 20, and memories 300 to 307 arranged on the second substrate portions 20. The plurality of second substrate portions 20, a controller 40, and a termination resistor 12 are arranged on the first substrate 10. In FIG. 1, the bus 11 formed inside the first substrate 10 is depicted for purposes of illustration. Hereinafter, the memories in the memory system 1 such as the memories 300 to 307 will be collectively referred to as the "memories 30". Each of the plurality of second substrate portions 20 is formed as a semiconductor chip on which one memory 30 is disposed.

Each of the second substrate portions 20 includes substrate connection terminals 201 and memory connection terminals 202. Each of the substrate connection terminals 201 and each of the memory connection terminals 202 are electrically connected to each other via a circuit (not shown in FIG. 1) in the second substrate portion 20. A plurality of terminals (hereinafter, referred to as "substrate terminals")

arranged on a first surface 101 and a second surface 102 of the first substrate 10 and connected to the bus 11, and a plurality of substrate connection terminals 201 of the second substrate portions 20 are electrically connected to each other. Each of the substrate terminals and each of the substrate connection terminals 201 are electrically connected to each other via, for example, a metal bump. That is, the second substrate portion 20 is electrically connected to the bus 11 via the substrate connection terminal 201 and the substrate terminal. For example, a printed circuit board assembly (PCBA) is used for the first substrate 10. A plurality of external terminals of the memory 30 (hereinafter, referred to as "memory terminals") and a plurality of memory connection terminals 202 of the second substrate portion 20 are electrically connected to each other. The memory terminal and the memory connection terminal 202 are electrically connected to each other via, for example, the metal bump. In this manner, the substrate terminal and the memory terminal are electrically connected to each other via the second substrate portion 20.

The controller 40 controls the memories 30 via the bus 11. The controller 40 is, for example, a semiconductor integrated circuit formed as a system on chip (SOC). A first end portion at one end of the bus 11 is connected to the controller 40. The termination resistor 12 is connected to a second end portion at the other end of the bus 11. For example, the controller 40 transmits, to each of the memories 30, a command signal that specifies a read operation and a write operation of data in the memory 30 and an address signal that specifies an address of the memory 30, via the first substrate 10 and the second substrate portions 20. Further, a clock signal, a clock enable signal, an ODT (On-die Termination) signal, and the like are transmitted from the controller 40 to the memory 30.

The controller 40 transmits to the memory 30 a selection signal (CS signal, CS 1 signal) that selects a memory which performs the read operation or the write operation of the data. Hereinafter, a memory 30, which is a target of the read and write operations of the data, is referred to as an "access target memory". Further, the access target memory is also referred to as a "first memory", and a memory 30 other than the access target memory is also referred to as a "second memory". That is, the controller 40 has a function of a memory controller that controls the memory 30.

The memory 30 includes, for example, an SDRAM having a memory chip of which an input and output interface includes a double-data-rate 4 (DDR4). Hereinafter, the memory including the memory chip of the DDR4 is also referred to as a "DDR4 memory".

In the example shown in FIG. 1, the memory 300, the memory 302, the memory 304, and the memory 306 arranged on the first surface 101 of the first substrate 10 are DDR4 memories of a dual die package (DDP). On the other hand, the memory 301, the memory 303, the memory 305, and the memory 307 arranged on the second surface 102 of the first substrate 10 are DDR4 memories of a single die package (SDP). Each storage capacity (particularly a maximum capacity) of the DDR4 memories is supplied in the form of the DDP or the SDP depending on a development time of a supply vendor or a process of a die of the DDR4 memory.

The memory of the DDP (hereinafter, referred to as a "DDP memory") includes two memory chips. The memory of the SDP (hereinafter, referred to as an "SDP memory") includes one memory chip. In this manner, the number of the mounted memory chips differs between the DDP memory and the SDP memory. That is, a load capacity of the memory chips differs between the DDP memory and the SDP memory by about twice (or a half time).

As described above, the memory system 1 includes the memories 30 having different storage capacities. As shown in FIG. 1, the DDP memories and the SDP memories face each other with the first substrate 10 interposed therebetween. Then, in the memory system 1, a command signal terminal to which the command signal is input and an address signal terminal to which the address signal is input, of each memory 30 arranged on the first substrate 10, are connected to the bus 11 in a fly-by manner. Therefore, since the memory system 1 has a three-rank configuration, a difference in a load capacity of the memory chips is generated in facing memories 30 (that is, the DDP memory and SDP memory) whose connection locations are adjacent to each other and that are branched from the bus 11. It is known that such a three-rank configuration has deterioration in a signal waveform quality as compared with other configurations (e.g., one rank, two ranks, and four ranks) due to an influence of reflection.

Figure 2:
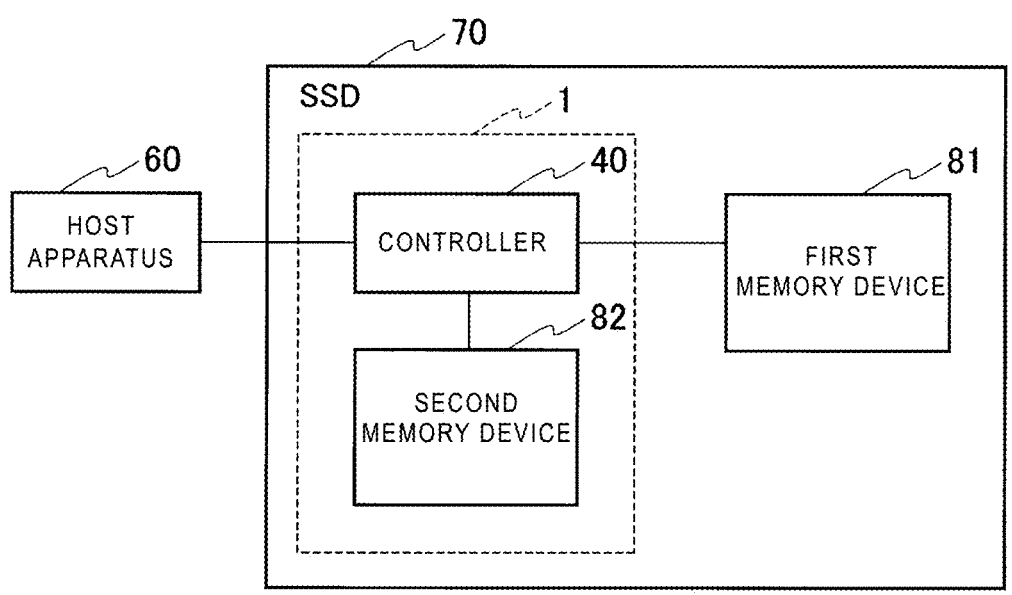
FIG. 2 is a schematic view showing the memory system according to the first embodiment applied to an SSD.

For example, as shown in FIG. 2, the memory system 1 may be used for an SSD 70 connectable to a host apparatus 60. The SSD 70 shown in FIG. 2 includes the controller 40, a first memory device 81, and a second memory device 82. The memory 30 may be used in the second memory device 82.

The first memory device 81 includes a nonvolatile semiconductor storage element such as a NAND flash memory. A storage capacity of the SSD 70 is determined by a storage capacity of the first memory device 81. The second memory device 82 includes a volatile semiconductor storage element such as a static random access memory (SRAM) or a synchronous dynamic random access memory (SDRAM). A storage capacity of the second memory device 82 is determined in accordance with the storage capacity of the first memory device 81. The configuration of the memory system 1 shown in FIG. 1 may be applied to a configuration including the controller 40 and the second memory device 82, which is surrounded by a broken line as shown in FIG. 2. The memory system 1 may include the controller 40 and the first memory device 81.

The host apparatus 60 is, for example, an information process apparatus, such as a server or a personal computer, a mobile phone, an imaging apparatus, an in-vehicle terminal such as a car navigation system, or a mobile terminal such as a tablet computer or a smartphone. Further, the host apparatus 60 may be a microprocessor mounted on the information process apparatus, the mobile phone, the mobile terminal, the in-vehicle terminal, or the like.

The controller 40 shown in FIG. 2 controls transmission of the data between the host apparatus 60 and the first memory device 81. That is, the controller 40 controls the read and write operations of the data in the first memory device 81 in accordance with a request from the host apparatus 60.

The controller 40 uses the second memory device 82 to temporarily store the data that is transmitted from the host apparatus 60 and to be stored in the first memory device 81. Further, the controller 40 uses the second memory device 82 to temporarily store the data to be read from the first memory device 81 and to be transmitted to the host apparatus 60. Still further, the controller 40 stores, in the first memory device 81, the data transmitted from the host apparatus 60, management information for managing the transmitted data, data read from the first memory device 81 and written again to the first memory device 81, and the like. During start-up, or when a read command or a write command is received from the host apparatus 60, a part or all of the management information stored in the first memory device 81 is loaded or cached into the second memory device 82. The controller 40 updates the management information loaded into the second memory device 82 and backs up the management information in the first memory device 81 at a predetermined timing. The management information includes, for example, mapping data indicating a correspondence between a logical address specified by the host apparatus 60 and a physical address of the first memory device 81.

SSD 70 is required to be operated at a high speed operation and to have a large capacity. Therefore, it is required to operate the first memory device 81 and the second memory device 82 that are included in the SSD 70 at a high speed or to increase a storage capacity. In order to operate the SSD 70 at the high speed, a quality of a signal waveform of a signal input to the first memory device 81 and the second memory device 82 and output therefrom is important. Therefore, the memory system 1 that can prevent the deterioration in the quality of the signal waveform related to the second memory device 82 and achieve the high-speed operation is preferable for the SSD 70.

For example, the memory system 1 according to the present embodiment is suitable for an enterprise-oriented SSD developed for a high-end server or a storage system requiring high performance and reliability.

It is conceivable to take a countermeasure that prevents the deterioration in the signal waveform by lowering an operation frequency of the second memory device 82 (i.e., the memory 30) mounted on the memory system 1 that is applied to the SSD 70. However, with such a countermeasure, it is not possible to meet the requirement for an improvement in the performance of the SSD 70, such as the increase in storage capacity and the increase in the operation speed.

By increasing or decreasing storage capacity of the memory 30 with respect to a desired storage capacity to make all the storage capacities of a plurality of memories 30 mounted on the memory system 1 constant, a method of preventing the reflection of the signal by avoiding the three-rank configuration whose load capacity is unbalanced may be considered. However, when the memory 30 having a relatively large storage capacity is used in order to make the storage capacities of all the memories 30 constant, a total amount of the storage capacities of the memories 30 mounted on the memory system 1 is excessive with respect to a required storage capacity. The memory 30 having the large storage capacity is higher in cost than the memory 30 having a relatively small storage capacity. Therefore, a cost of the memory system 1 applied to the SSD 70 is increased by using the memory 30 having the large storage capacity. When the memory 30 having a relatively small storage capacity is used in order to make the storage capacities of all the memories 30 constant, since the total amount of the storage capacities of the memories 30 mounted on the memory system 1 is reduced, there is a possibility that the requirement for the performance improvement of the SSD 70 cannot be met.

On the other hand, adopting the three-rank configuration in which the DDP memory and the SDP memory are mixed may be cost effective by setting the total amount of the storage capacities of the memories 30 mounted on the memory system 1 to a desired amount. As an example, a case is considered where an SDRAM of the SDP having a maximum capacity of 8 Gb and an SDRAM of the DDP having a maximum capacity of 16 Gb (8 Gb×2) may be selected as the DDR4 memory, and the total amount of storage capacities of the memories 30 mounted on the SSD 70 is required to be 80 Gb. In this case, from a viewpoint of the signal quality, it is preferable to configure the storage capacities by 128 Gb of 8 pieces of 16 Gb DDPs, but from a viewpoint of the cost, it is preferable to configure the storage capacities by 96 Gb of 4 pieces of 16 Gb DDPs+4 pieces of 8 Gb SDPs.

The first memory device 81 mounted on the SSD 70 is mainly a NAND flash memory, but as described above, the storage capacity required for the second memory device 82 is increased proportionally as the storage capacity of the first memory device 81 is increased. Therefore, it is generally required to adjust the storage capacity of the second memory device 82 in accordance with the storage capacity of the first memory device 81.

In order to improve the performance of the SSD 70 on which the memory system 1 is mounted, the memory system 1 needs to be operated at a desired operation frequency regardless of a total amount of the storage capacity of the second memory device 82. However, the memory system 1 may be prevented from performing an operation at a high speed due to the unbalanced load capacity represented by the three ranks.

Figure 3:
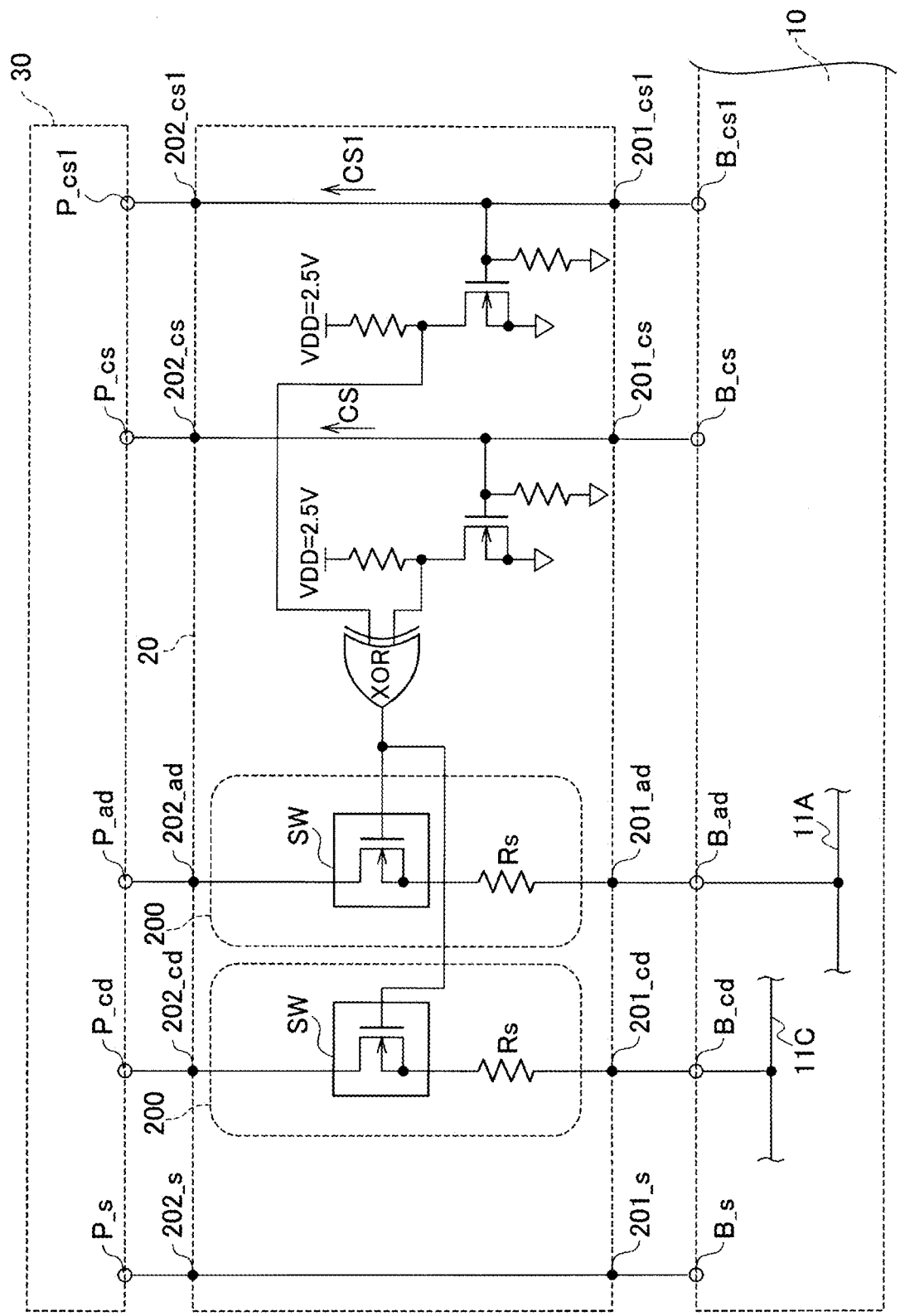
FIG. 3 is a circuit diagram showing an internal configuration of a second substrate portion of the memory system according to the first embodiment.

On the contrary, in the memory system 1 according to the first embodiment, the second substrate portion 20 prevents the deterioration in the quality of the signal waveform at the bus 11 caused by the reflection of the signal. A configuration and a function of the second substrate portion 20 will be described below with reference to FIG. 3. FIG. 3 is a circuit diagram showing an internal configuration of the second substrate portion 20 of the memory system 1 according to the first embodiment.

As shown in FIG. 3, the second substrate portion 20 includes bus switching circuits 200. In each of the bus switching circuits 200, a switching element SW and a resistor Rs are connected in series between the substrate connection terminal 201 and the memory connection terminal 202. At least a part of the memory terminals of each memory 30 (for example, a command signal terminal P_cd and an address signal terminal P_ad in FIG. 3) is connected to the memory connection terminal 202 to which the bus switching circuit 200 is connected. Another memory terminal of the memory 30 (for example, a memory terminal P_s in FIG. 3) is directly connected to the memory connection terminal 202 directly connected to the substrate connection terminal 201. The bus switching circuit 200 is arranged for each memory 30 in the second substrate portion 20. Hereinafter, the bus switching circuit 200 connected to the first memory (that is, the memory 30 being an access target) is also referred to as a "first circuit", and the bus switching circuit 200 connected to the second memory (that is, the memory 30 not being the access target) is also referred to as a "second circuit". That is, the first circuit and the second circuit differ only in whether the connected memory 30 is the access target, and both are the bus switching circuits 200 having the same configuration.

The substrate connection terminal 201 connected to the first circuit is also referred to as a "first terminal", and the memory connection terminal 202 connected to the first circuit is also referred to as a "second terminal". Further, the substrate connection terminal 201 connected to the second circuit is also referred to as a "third terminal", and the memory connection terminal 202 connected to the second circuit is also referred to as a "fourth terminal". That is, the second substrate portion 20 includes at least one of the first circuit connected between the first terminal and the second terminal and the second circuit connected between the third terminal and the fourth terminal. The switching element SW of the first circuit and the switching element SW of the second circuit are controlled by the controller 40. When the switching element SW of the first circuit is turned on, the first terminal and the second terminal are electrically connected to each other via the resistor Rs. On the other hand, when the switching element SW of the second circuit is turned off, the third terminal and the fourth terminal are electrically insulated from each other.

FIG. 3 shows an example in which the signal terminals of the memory 30 that are connected to the bus switching circuits 200 via the memory connection terminals 202 of the second substrate portion 20 are the command signal terminal P_cd and the address signal terminal P_ad. That is, a memory connection terminal 202_cd of the second substrate portion 20 is connected to the command signal terminal P_cd of the memory 30, and a substrate connection terminal 201_cd of the second substrate portion 20 is connected to a command signal terminal B_cd of the first substrate 10. The bus switching circuit 200 in which the resistor Rs is connected in series to the switching element SW is disposed between the substrate connection terminal 201_cd and the memory connection terminal 202_cd. Further, a memory connection terminal 202_ad of the second substrate portion 20 is connected to the address signal terminal P_ad of the memory 30, and a substrate connection terminal 201_ad of the second substrate portion 20 is connected to an address signal terminal B_ad of the first substrate 10. Then, the bus switching circuit 200 in which the resistor Rs is connected in series to the switching element SW is disposed between the substrate connection terminal 201_ad and the memory connection terminal 202_ad.

In FIG. 3, an address bus 11A through which an address signal transmitted in the bus 11 is electrically connected to the substrate connection terminal 201_ad of the second substrate portion 20 via the address signal terminal B_ad of the first substrate 10. The address signal, transmitted via the address bus 11A, is transmitted to the memory connection terminal 202_ad via the substrate connection terminal 201_ad, and via the resistor Rs and the switching element SW formed in the second substrate portion 20, and is received by the memory 30. That is, the bus switching circuit 200 is disposed between the address bus 11A and the address signal terminal P_ad of the memory 30.

In FIG. 3, a command bus 11C through which a command signal transmitted in the bus 11 is electrically connected to the substrate connection terminal 201_cd of the second substrate portion 20 via the command signal terminal B_cd of the first substrate 10. The command signal, transmitted via the command bus 11C, is transmitted to the memory connection terminal 202_cd via the substrate connection terminal 201_cd, and via the resistor Rs and the switching element SW formed in the second substrate portion 20, and is received by the memory 30. That is, the bus switching circuit 200 is disposed between the command bus 11C and the command signal terminal P_cd of the memory 30.

Each of the signal terminals of the memory 30, which is connected to the bus switching circuit 200 including the switching element SW and the resistor Rs, may be electrically disconnected from the bus 11 when the chip is not selected in accordance with a specification of the memory 30. On the other hand, the signal terminal of the memory 30 through which a signal that must always be input is transmitted is not connected to the bus switching circuit 200 that includes the switching element SW and the resistor Rs. For example, the bus switching circuit 200 is not connected to the signal terminal to which the clock signal, the clock enable signal, and the ODT signal are input.

The signal terminal not connected to the bus switching circuit 200 that includes a clock terminal and a clock enable terminal of the memory 30, an ODT terminal, and the like is also directly connected to the substrate terminal via the second substrate portion 20. FIG. 3 shows the memory terminal P_s as an example of the signal terminal not connected to the bus switching circuit 200. A memory connection terminal 202_s of the second substrate portion 20 connected to the memory terminal P_s is short-circuited inside the second substrate portion 20 with a substrate connection terminal 201_s connected to the signal terminal B_s of the first substrate 10. Further, a GND terminal and a power supply terminal of the memory 30 are electrically connected to the substrate terminals of the first substrate 10 via, for example, a via that penetrates the second substrate portion 20. The resistor Rs may be disposed between the substrate connection terminal 201_s and the memory connection terminal 202_s.

The switching element SW is controlled to be turned on or off according to control signals, e.g., selection signals including the CS signal and the CS1 signal that are transmitted from the controller 40 via the first substrate 10. A CS terminal to which the CS signal is input is connected on a one-to-one basis to the controller 40 for each memory chip in the memory 30 for chip selection. When the DDP memory is mounted on the second substrate portion 20, since either one of the memory chips is always accessed by the two selection signals from the controller 40, the turned-on or turned-off control of the switching element SW is performed by receiving the two selection signals by an XOR gate. On the other hand, although the SDP memory is controlled by other two selection signals separately transmitted from the controller 40, the CS1 signal is always controlled to be a high level. Although one of the bus switching circuits 200 is shown as a representative, the present disclosure is not limited thereto as long as a similar function can be achieved.

In the memory system 1, the switching element SW that is connected to the chip selected by the selection signals is turned on under the control of the controller 40. Accordingly, the bus 11 and the signal terminal of the first memory that is the selected memory are connected to each other via the resistor Rs. The resistor Rs has a function of preventing reflection of a signal (i.e., SSTL) from the signal terminal of the first memory on the bus 11.

On the other hand, the switching element SW connected to the chip not selected by the selection signals is turned off under the control of the controller 40. Accordingly, a load capacity of the memory 30 (i.e., the second memory) that is the non-selected memory cannot be seen from the bus 11, which therefore contributes to the prevention of the reflection.

In FIG. 3, the resistor Rs is generally set to about half an impedance of the bus 11 from a viewpoint of the SSTL. The resistor Rs may be a variable resistor that is formed in a semiconductor and has an adjustable resistance value.

As described above, in the memory system 1, only the first memories are connected to the bus 11 via the resistors Rs, and the second memories are disconnected from the bus 11. As a result, according to the memory system 1, the reflection of the signal on the bus 11 is prevented.

In order to compare with the memory system 1, a memory system of a comparative example in which the memories 30 are arranged on the first substrate 10 without using the second substrate portions 20 will be described below. In the memory system of the comparative example shown in FIG.

4, four DDP memories (i.e., the memory 300, the memory 302, the memory 304, and the memory 306) are arranged on the first surface 101 of the first substrate 10. Then, four SDP memories (i.e., the memory 301, the memory 303, the memory 305, and the memory 307) are arranged on the second surface 102 of the first substrate 10.

Figure 4:
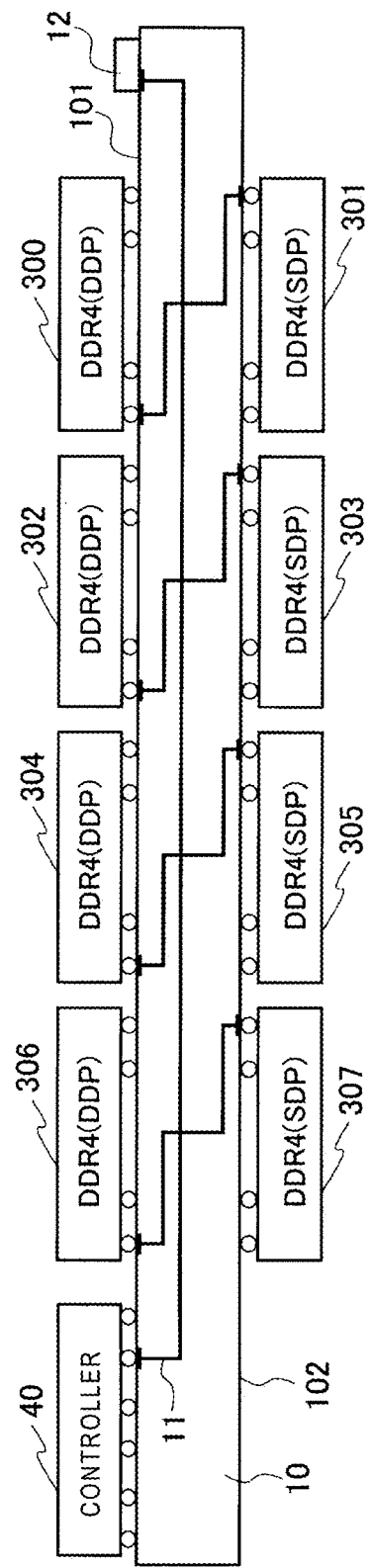
FIG. 4 is a schematic view showing a configuration of a memory system of a comparative example.
Figure 5:
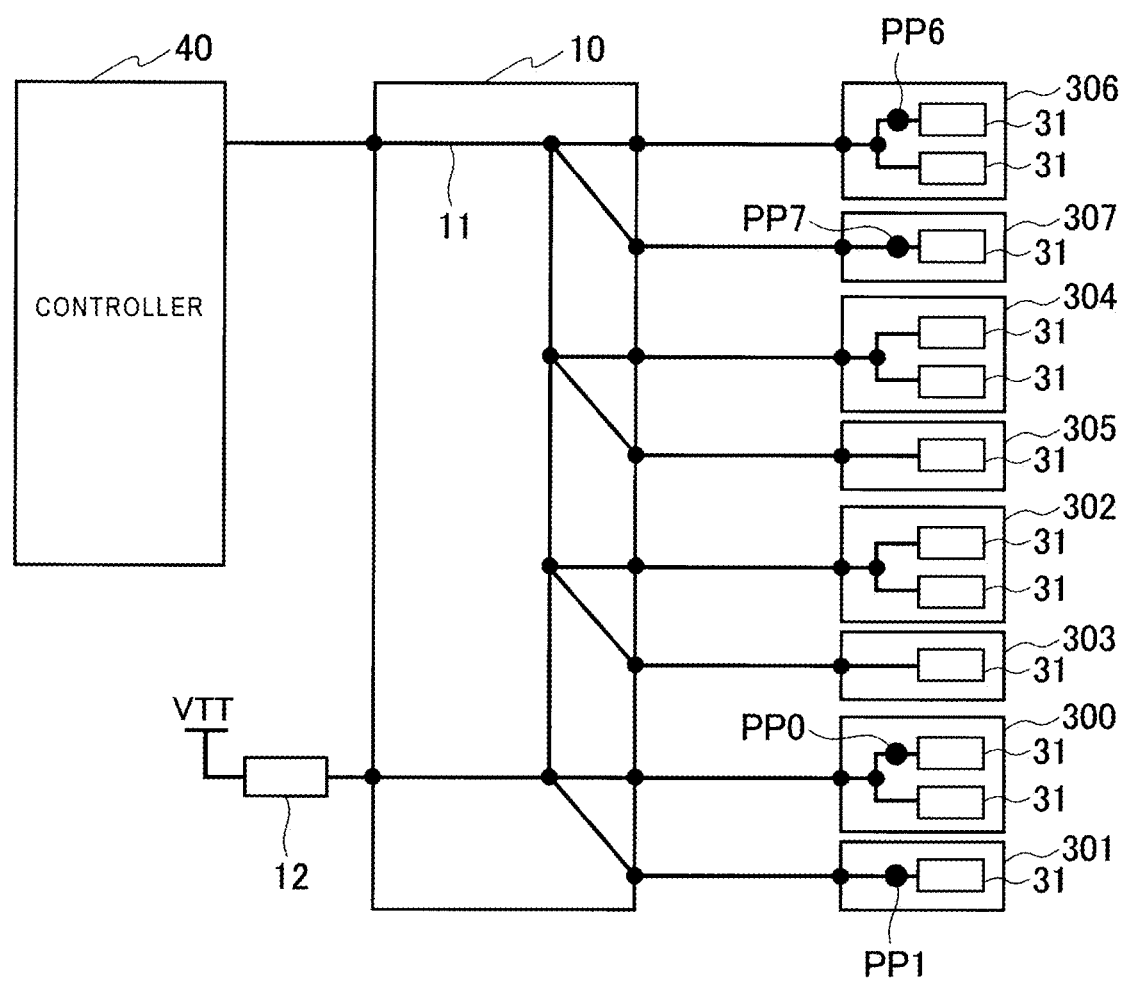
FIG. 5 is a circuit configuration diagram of the memory system of the comparative example.

FIG. 5 shows a circuit configuration diagram in which a command signal and an address signal of the memory system shown in FIG. 4 are transmitted. The DDP memory includes two memory chips 31, and the SDP memory includes one memory chip 31. The command signal and the address signal are transmitted via the bus 11 in a fly-by manner. Further, the bus 11 is connected to a voltage VTT via the termination resistor 12. Hereinafter, simulation results of signal waveforms performed on the circuit configuration diagram shown in FIG. 5 will be described.

Figure 6A:
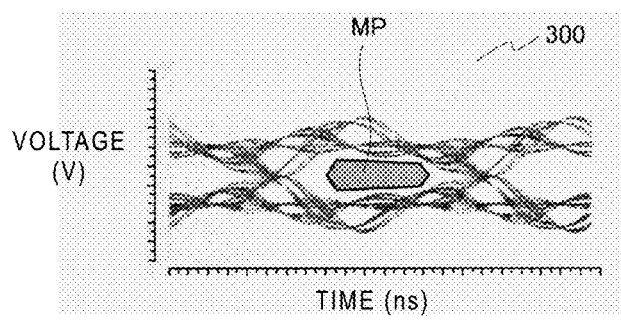
FIGS. 6A-6D show simulation results of signal waveforms of the memory system of the comparative example.
Figure 6B:
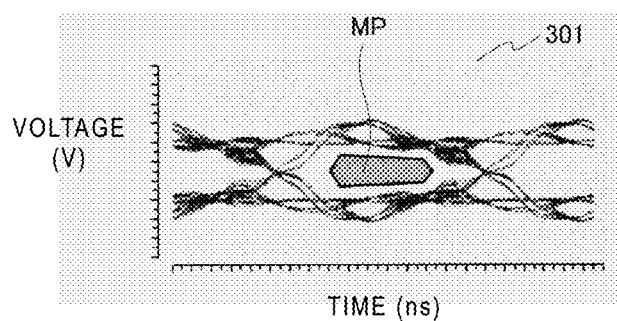
Figure 6C:
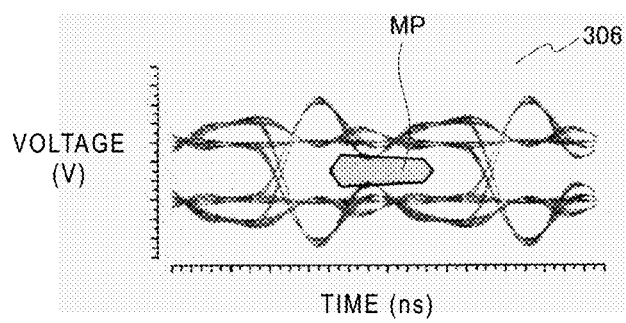
Figure 6D:
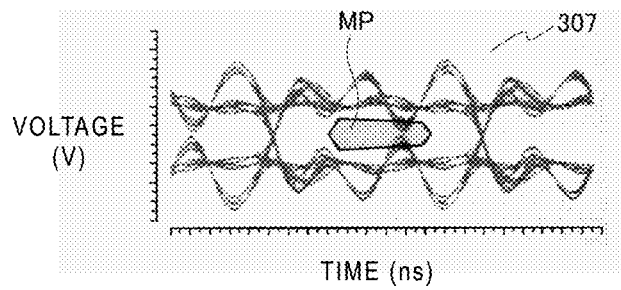

FIGS. 6A to 6D show simulation results related to the memory system of the comparative example. FIG. 6A shows the simulation result of the signal waveform observed at a terminal PP0 of one memory chip 31 of the memory 300 shown in FIG. 5. FIG. 6B shows the simulation result of the signal waveform observed at a terminal PP1 of the memory chip 31 of the memory 301. FIG. 6C shows the simulation result of the signal waveform observed at a terminal PP6 of one memory chip 31 of the memory 306. FIG. 6D shows the simulation result of the signal waveform observed at a terminal PP7 of the memory chip 31 of the memory 307.

An eye mask pattern MP for determining whether the waveform quality of the signal waveform is good is displayed as being superimposed on the drawing of the simulation result. When the signal waveform is superimposed on the eye mask pattern MP, it is determined that the waveform quality does not satisfy a predetermined standard.

As shown in FIGS. 6A and 6B, in the memory system of the comparative example, waveform qualities of the memory 300 and the memory 301 that are arranged on a side far from the controller 40 satisfy the predetermined standard. On the other hand, as shown in FIGS. 6C and 6D, in the memory 306 and the memory 307 that are arranged on a side near the controller 40, waveform qualities do not satisfy the standard. A difference in waveform qualities between the memory 306 and the memory 307 is dominated by multiple reflection therebetween caused by the load imbalance, and a difference in waveform qualities between the memory 306 and the memory 300 is caused by an effective impedance difference.

On the contrary, in the memory system 1 in the present embodiment, the reflection of the signal is prevented by the second substrate portions 20, and the deterioration in the quality of the signal waveform at the bus 11 is prevented. Hereinafter, simulation results of signal waveforms performed on the circuit configuration diagram of the memory system 1 in the present embodiment shown in FIG. 7 will be described. For comparison, same values of drive strength and termination resistance of the controller 40 are used.

Figure 8A:
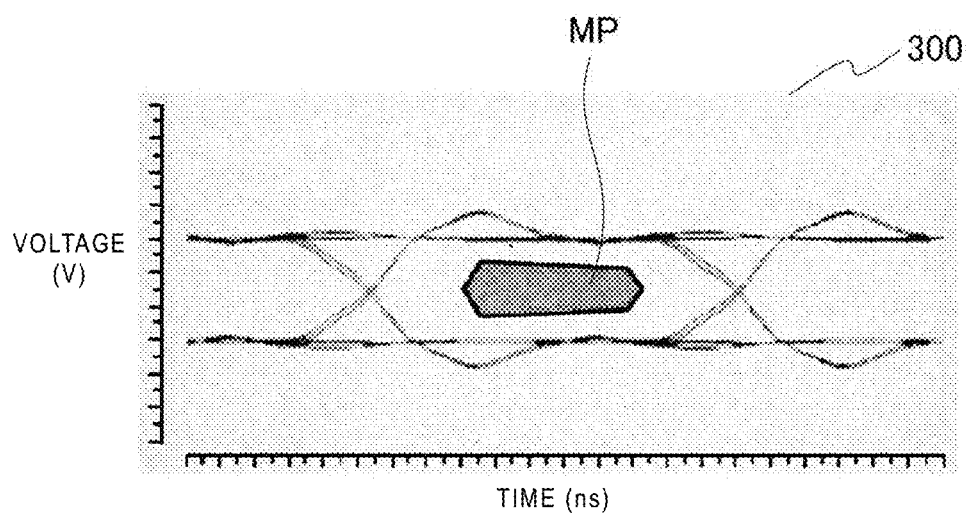
FIGS. 8A and 8B show simulation results of signal waveforms of the memory system according to the first embodiment.
Figure 8B:
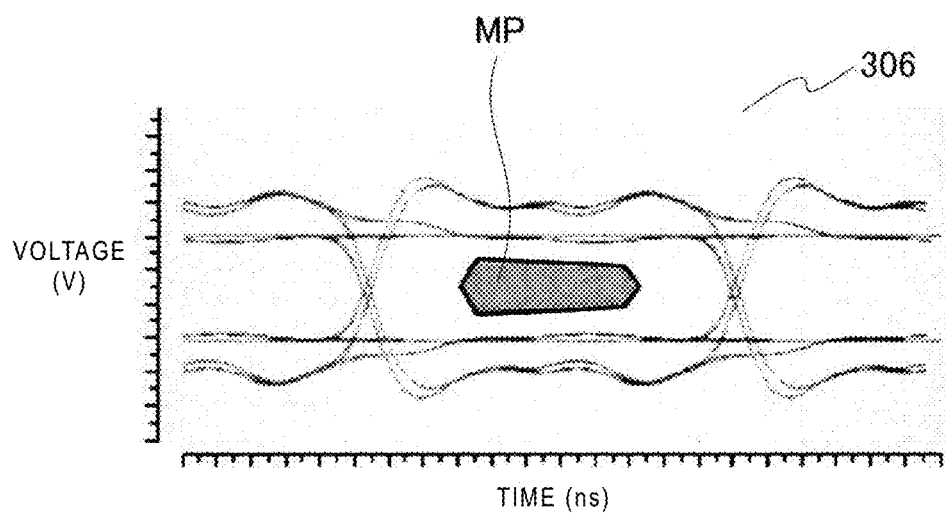

The simulation is performed by connecting the DDP memories 300, 302, 304, and 306 to the bus 11 and disconnecting the SDP memories 301, 303, 305, and 307 from the bus 11. That is, the switching elements SW of the bus switching circuits 200 connected to the DDP memories 300, 302, 304, and 306 are turned on, and the switching elements SW of the bus switching circuits 200 connected to the SDP memories 301, 303, 305, and 307 are turned off. FIG. 8A shows the simulation result of the signal waveform observed at a terminal PP0 of one memory chip 31 of the memory 300 shown in FIG. 7. FIG. 8B shows the simulation result of the signal waveform observed at a terminal PP6 of one memory chip 31 of the memory 306. As shown in FIGS. 8A and 8B, the deterioration in the quality of the signal waveform is prevented. As described above, the reduction in the load capacity and the reflection are prevented by the second substrate portions 20, and therefore the deterioration in the quality of the signal waveform is prevented.

Each of the second substrate portions 20 may be formed by a component, for example, a silicon interposer (Si I/P), that electrically connects the substrate terminals of the first substrate 10 to the memory terminals of the memory 30 by an internal wiring. An example of the second substrate portion 20 formed by an interposer 21 will be described with reference to FIG. 9.

The interposer 21 is mounted with an integrated circuit (IC) 22 including the circuit shown in FIG. 3. The IC 22 is a component in which active components such as the switching element SW and a logic circuit and a passive component including the resistor Rs or the like are formed in the semiconductor. The IC 22 is connected to the interposer 21, for example, as a flip chip. The second substrate portion 20 is formed with the interposer 21 and the IC 22. Further, in FIG. 9, wirings 23 and 25 formed on the interposer 21 are examples of connection elements, and are displayed as passed through the interposer 21 (similarity applies hereinafter). The IC 22 is an example of a component formed of a semiconductor, and a small wafer-level-chip-size package (WLCSP) or the like may be used instead of the flip chip. A configuration may be adopted in which the IC 22 is mounted on the interposer by a small packaging technology capable of forming a bump at a narrow pitch.

Figure 9:
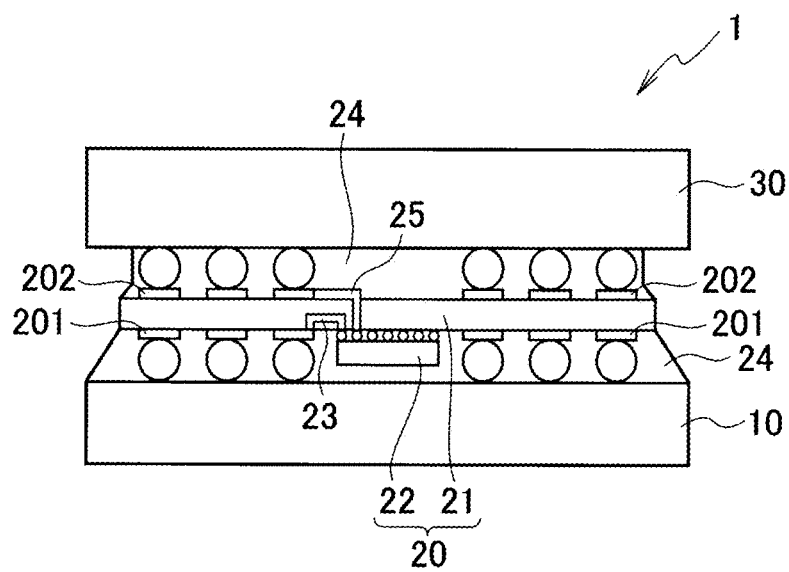
FIG. 9 is a schematic side view showing a configuration of the second substrate portion of the memory system according to the first embodiment.

As shown in FIG. 9, a space between the first substrate 10 and the second substrate portion 20 and a space between the memory 30 and the second substrate portion 20 may be sealed with an underfill agent 24. The underfill agent 24 is, for example, an epoxy resin, a polyurethane resin, a silicone resin, a polyester resin, or a material having a filler contained in these resins.

Figure 10:
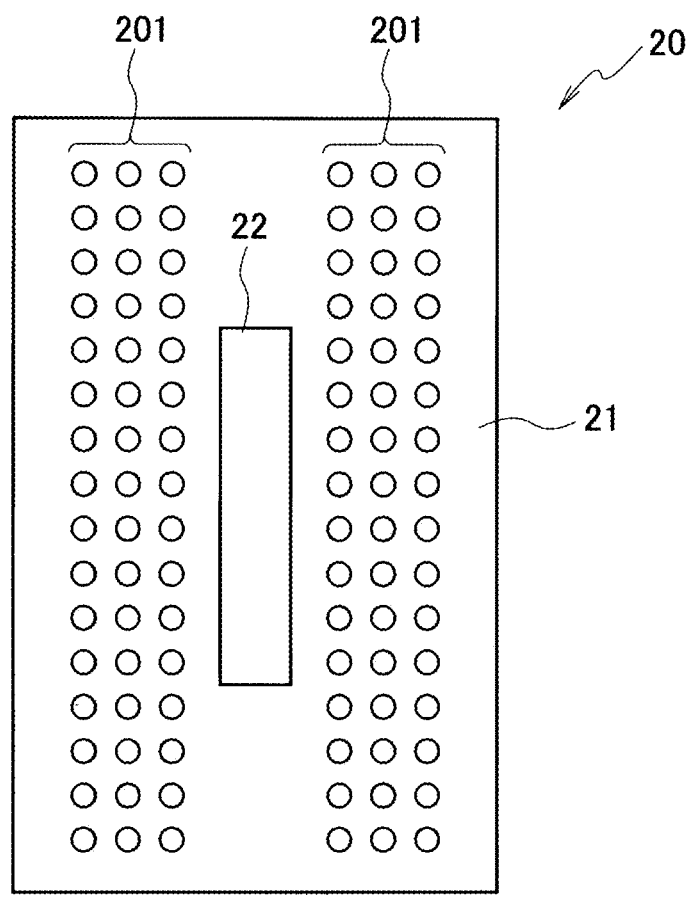
FIG. 10 is a schematic plan view of the second substrate portion of the memory system according to the first embodiment.

For example, as shown in FIG. 10, the IC 22 is disposed on a central region of a surface of the interposer 21 on a side of the first substrate 10. At this time, a terminal of a signal line connected to the IC 22 on the interposer 21 is preferably disposed at a position close to the IC 22 among the substrate connection terminals 201. Accordingly, the terminals of the interposer 21 and the terminal of the IC 22 can be connected at a short distance. Further, a DQ signal and a DQS signal can be controlled by a method similar to the method for controlling the command signal and the address signal with the bus switching circuit 200. Accordingly, branching of the DQ signal and branching of the DQS signal can be reduced. Any size of the IC 22 may be used, and a plurality of ICs 22 may be mounted.

Figure 11:
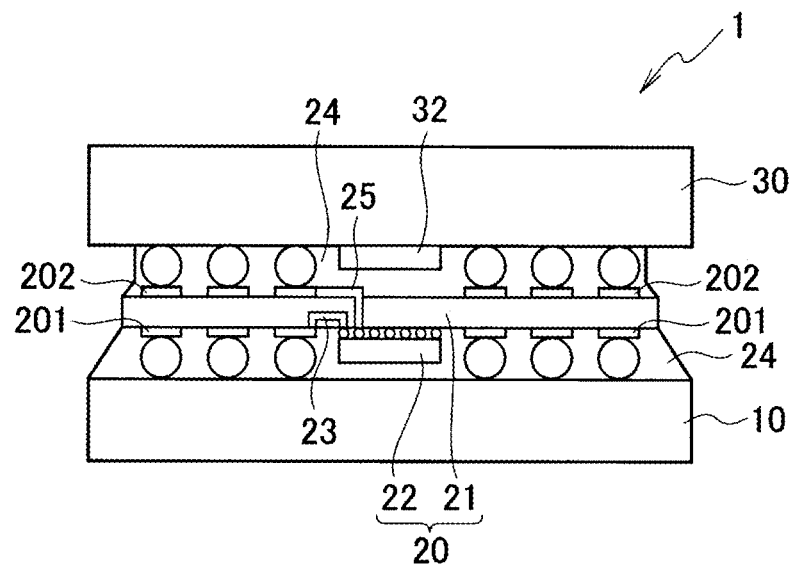
FIG. 11 is a schematic side view showing a memory having another shape disposed on the second substrate portion shown in FIG. 9.

As shown in FIG. 11, the memory 30 disposed on the second substrate portion 20 may have a convex portion 32 formed on a surface on which the memory terminals are arranged. Even in the memory 30 having such a structure, by disposing the IC 22 on the surface of the interposer 21 on the side of the first substrate 10, the memory 30 and the IC 22 are not in contact with each other even when an interval between the memory 30 and the interposer 21 is not widened. Therefore, an increase in a size of the memory system 1 can be prevented.

For example, a glass interposer or a glass epoxy substrate other than a silicon interposer may be adopted as the interposer 21 of the second substrate portion 20.

As described above, in the memory system 1 according to the first embodiment, the second substrate portion 20 is disposed between the first substrate 10 and the memory 30.

The bus switching circuit 200 that disconnects a load of a wiring of the command signal or the address signal is mounted in the second substrate portion 20. The bus switching circuit 200 electrically connects the first memory to the bus 11 via the resistor Rs, and electrically disconnects the second memory from the bus 11. Therefore, the unbalance of the load capacity is solved by the bus switching circuit 200. Then, by incorporating the resistor Rs into the bus switching circuit 200, the reflection of the signal on the bus 11 is prevented.

Therefore, according to the memory system 1, for example, even when the memory 30 has the three-rank configuration or the like and the load capacity is relatively unbalanced, the deterioration in the quality of the signal waveform at the bus 11 caused by the reflection of the signal is prevented. Therefore, the memory system 1 can be operated at a high speed.

The memory system 1 has a configuration in which the memory 30 is mounted on the first substrate 10 as a component mounted on the second substrate portion 20. Further, a configuration in which the IC 22 is disposed on the interposer 21 can be adopted for the second substrate portion 20. In this manner, a package on package (POP) structure is adopted in the memory system 1. Therefore, according to the memory system 1, the reflection of the signal can be prevented even when the first substrate 10 does not have enough space for disposing an anti-reflection component. According to the memory system 1, there is enough space on the first substrate 10, and the resistor Rs can be disposed on an ideal position.

In the above description, the case where the memory 30 has the three-rank configuration is described. However, in a case where the memory 30 has a two-rank configuration or a four-rank configuration, the memory system 1 is also preferably applied. That is, the load capacity of the memory 30 connected to the bus switching circuit 200 in which the switching element SW is turned off is electrically disconnected from the bus 11, for example, the two-rank configuration appears to be a one-rank configuration. Therefore, the reflection on the bus 11 is prevented, the load capacity connected to the bus 11 is reduced, and the memory system can be increased in speed.

The memory signal terminal to which the bus switching circuit 200 is connected may be a signal terminal other than the command signal terminal and the address signal terminal. For example, the bus switching circuit 200 may be connected to a data signal terminal through which the data read from and written to the memory 30 is transmitted.

Second Embodiment

Figure 12:
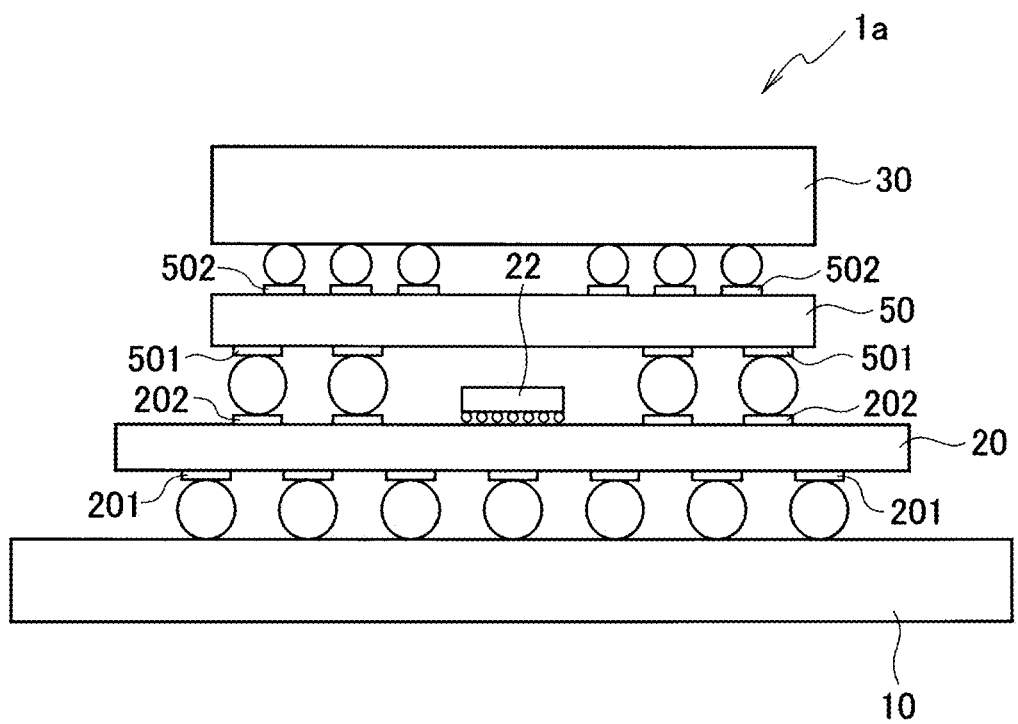
FIG. 12 is a schematic view showing a configuration of a memory system according to a second embodiment.

FIG. 12 shows a configuration of a memory system 1a according to a second embodiment. The memory system 1a shown in FIG. 12 is different from that of the first embodiment in that a wiring substrate 50 is disposed between the second substrate portion 20 and the memory 30.

Substrate-side terminals 501, which are electrically connected to the memory connection terminals 202 of the second substrate portion 20, are arranged on a surface of the wiring substrate 50 facing the second substrate portion 20. The memory connection terminal 202 and the substrate-side terminal 501 are connected by, for example, a metal bump. Memory-side terminals 502 connected to the memory terminals are arranged on the surface of the wiring substrate 50 facing the memory 30. A wiring (not shown) that connects the substrate-side terminals 501 to the memory-side terminals 502 is formed in the wiring substrate 50.

On the second substrate portion 20 shown in FIG. 12, the IC 22 is disposed on a surface facing the wiring substrate 50. Therefore, a degree of freedom for arranging the substrate connection terminals 201 connected to the substrate terminals of the second substrate portion 20 is high.

Figure 13:
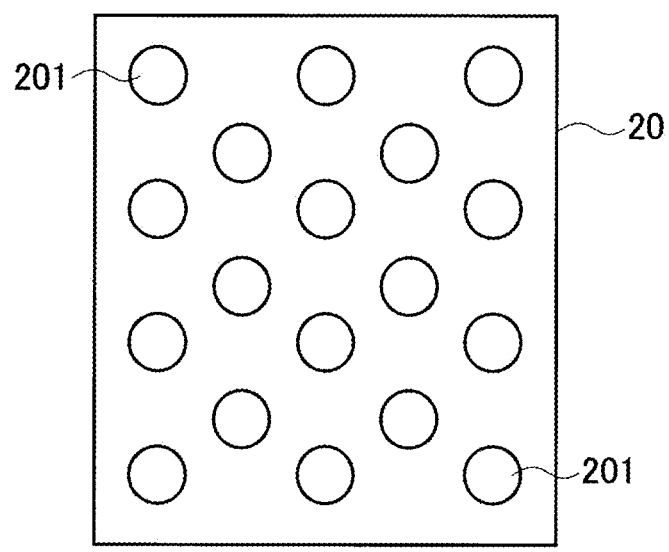
FIG. 13 is a schematic plan view showing an arrangement of first terminals of the second substrate portion in the memory system according to the second embodiment.

For example, as shown in FIG. 13, the substrate connection terminals 201 are arranged in a staggered manner on a surface of the second substrate portion 20 on a side of the first substrate 10. At this time, the memory connection terminals 202 are arranged, corresponding to the arrangement of the substrate connection terminals 201, in the staggered manner on the surface of the second substrate portion 20 on a side of the memory 30. The wiring substrate 50 electrically connects the memory connection terminals 202 arranged in the staggered manner to the memory terminals. That is, a wiring that connects the memory terminals to the memory connection terminals 202 is drawn out by the wiring substrate 50.

According to the memory system 1a in the second embodiment, the terminals of the first substrate 10 and the second substrate portion 20 may be arranged regardless of the terminal arrangement of the memory 30. Accordingly, a degree of freedom in design of the first substrate 10 is increased.

Figure 14:
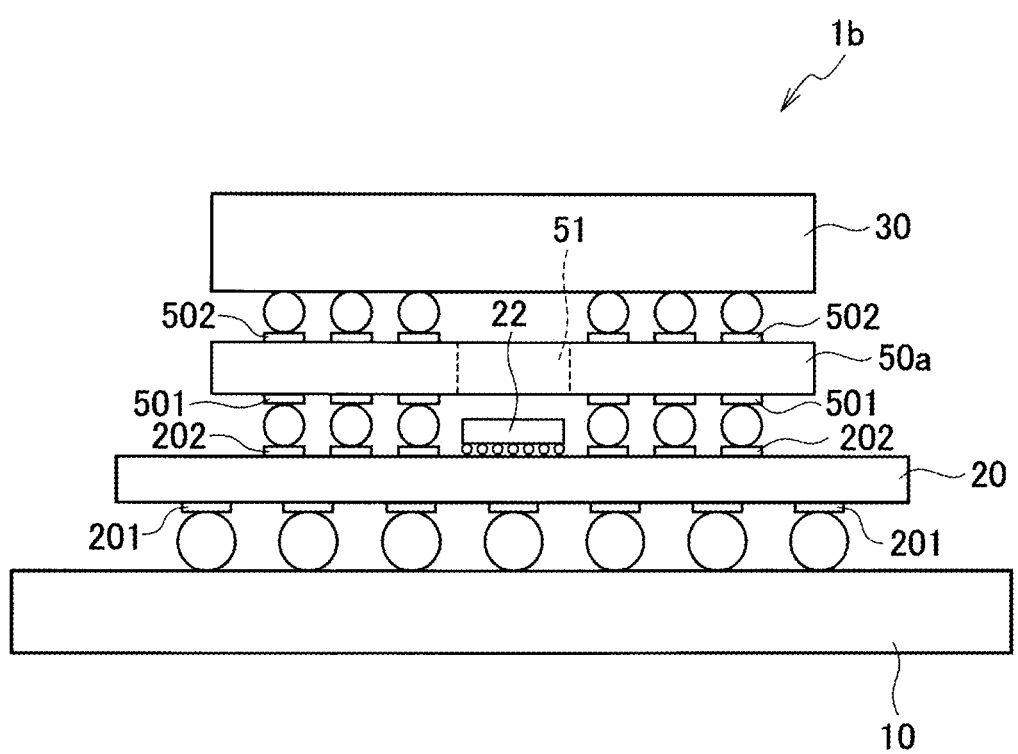
FIG. 14 is a schematic view showing a configuration of a memory system according to a modification of the second embodiment.
Figure 15:
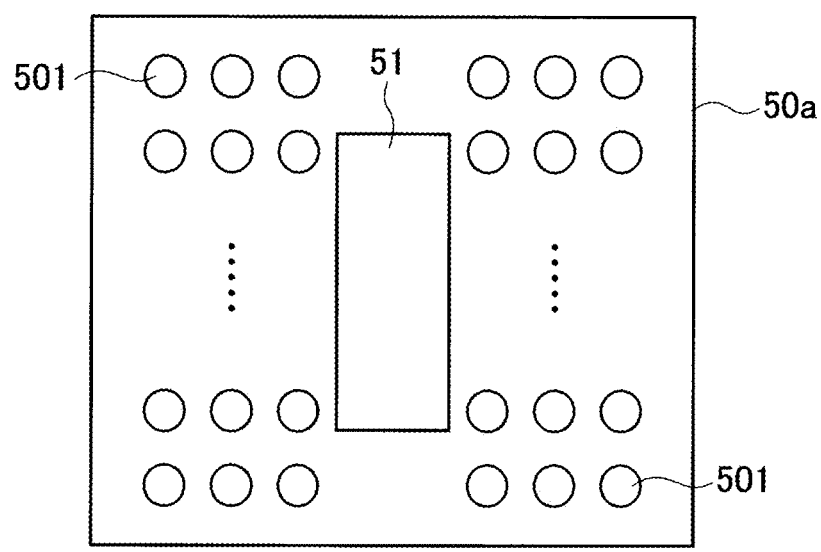
FIG. 15 is a schematic plan view of a wiring substrate of the memory system shown in FIG. 14.

FIG. 14 shows a configuration of a memory system 1b according to a modification of the second embodiment. In a wiring substrate 50a of the memory system 1b shown in FIG. 14, a cavity 51 is formed in a region overlapping a region where the IC 22 is disposed in a plan view. FIG. 15 shows a plan view of the wiring substrate 50a. Since there is no wiring substrate 50a above the IC 22, that is, there is the cavity 51 of the wiring substrate 50a above the IC 22, an interval between the second substrate portion 20 and the wiring substrate 50a can be shortened without the IC 22 and the wiring substrate 50a being in contact with each other. Accordingly, the memory system 1 is reduced in size.

Third Embodiment

Figure 16:
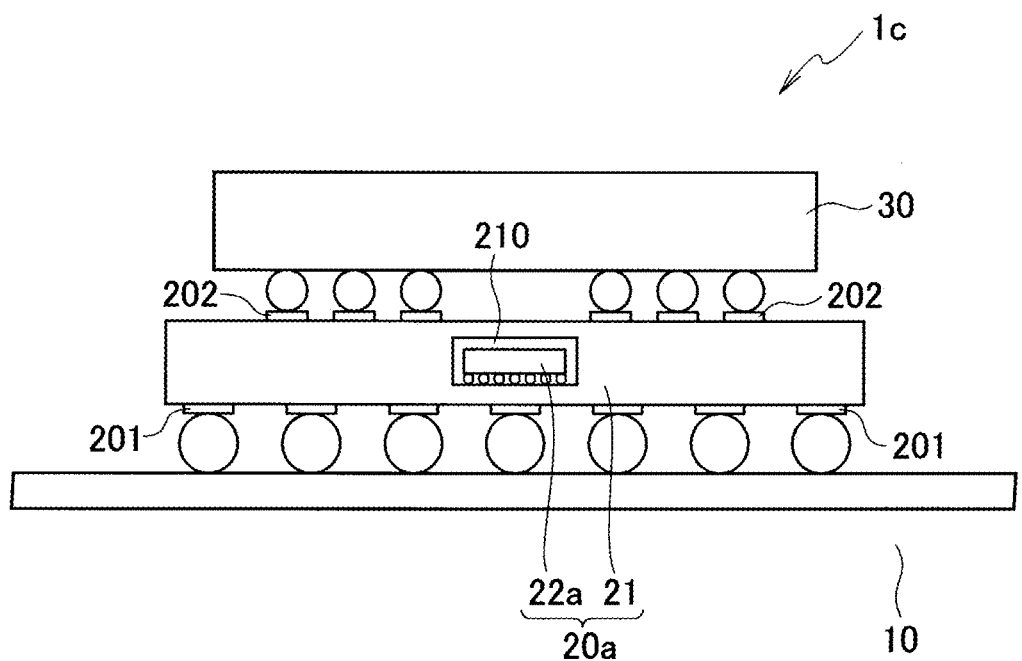
FIG. 16 is a schematic view showing a configuration of a memory system according to a third embodiment.

FIG. 16 shows a configuration of a memory system 1c according to a third embodiment. The memory system 1c shown in FIG. 16 is different from that of the first embodiment in that the memory system 1c includes the second substrate portion 20a, and an IC 22a is disposed inside the second substrate portion 20a. FIG. 16 shows the IC 22a as passed through a side surface of the second substrate portion 20. The IC 22a in the third embodiment includes a circuit similar to that of the IC 22.

For example, a space 210 is provided inside the interposer 21. Then, the IC 22a is disposed inside the space 210. Accordingly, the substrate connection terminals 201 can be disposed on an entire surface of the interposer 21 on a side of the first substrate 10. Further, a component other than the IC 22a can be disposed inside the space 210. Therefore, a size of the memory system 1c is reduced.

Fourth Embodiment

Figure 17:
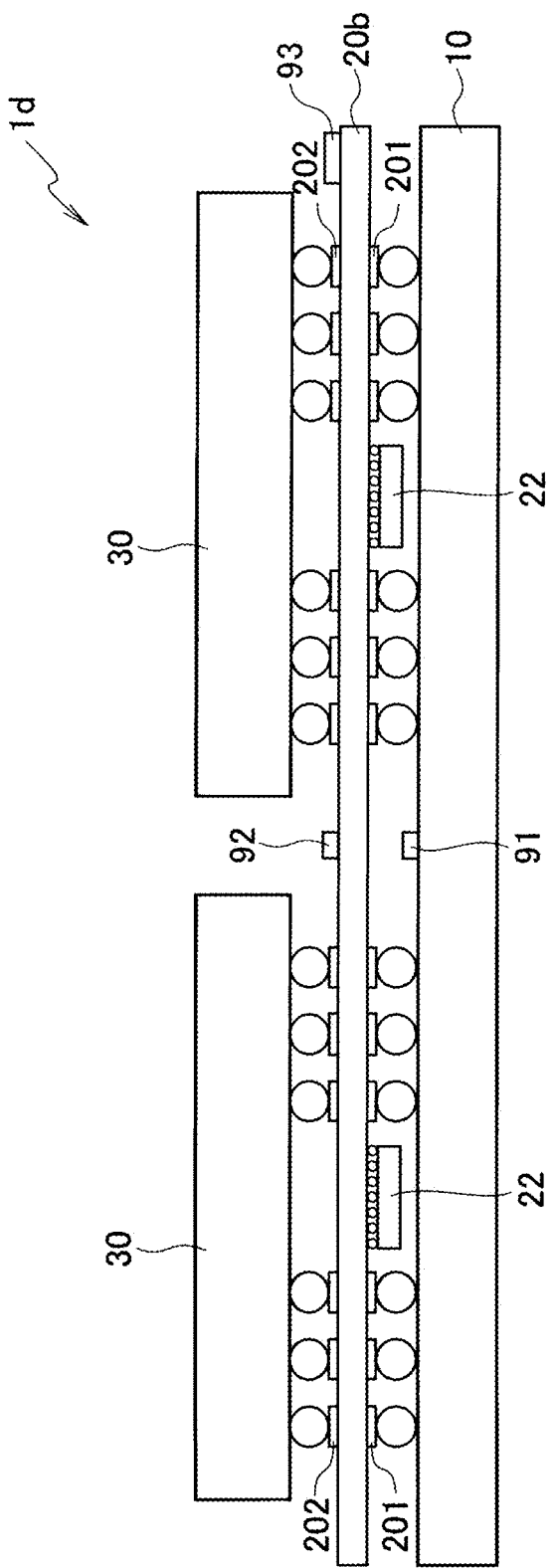
FIG. 17 is a schematic view showing a configuration of a memory system according to a fourth embodiment.

FIG. 17 shows a configuration of a memory system 1d according to a fourth embodiment. The memory system 1d shown in FIG. 17 is different from that of the first embodiment in that the memory system 1d includes a second substrate portion 20b, and the second substrate portion 20b of the memory system 1d is shared by the plurality of memories 30. That is, a plurality of bus switching circuits 200 are arranged in one second substrate portion 20b.

FIG. 17 shows a state where the second substrate portion 20b on which two memories 30 are arranged is disposed on one surface of the first substrate 10. However, any number of the memories 30 may be arranged on the second substrate portion 20b. Further, the second substrate portion 20b may be disposed on another surface of the first substrate 10 opposite to the one surface. For example, as shown in FIG. 1, one second substrate portion 20b on which four memories 300, 302, 304, and 306 are arranged is disposed on a side of the first surface 101 of the first substrate 10. In the second substrate portion 20b, individual bus switching circuits 200 are prepared for the memory 300, the memory 302, the memory 304, and the memory 306. On the other hand, one second substrate portion 20b on which four memories 301, 303, 305 and 307 are arranged is disposed on a side of the second surface 102 of the first substrate 10. That is, the second substrate portion 20 includes a single substrate on which both the first memory and the second memory are disposed. In the second substrate portion 20b, individual bus switching circuits 200 are disposed for the memory 301, the memory 303, the memory 305, and the memory 307.

According to the memory system 1d in the fourth embodiment, various additional components may be arranged on the second substrate portion 20b. For example, as shown in FIG. 17, passive components 91 and 92 such as a chip capacitor and a resistor may be disposed on the second substrate portion 20b and the first substrate 10, respectively. Further, a test pad 93 disposed on the second substrate portion 20b is used, whereby electrical characteristics of the memory system 1d or the plurality of memories 30 can be tested.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a first substrate including a first signal terminal and a second signal terminal electrically connected to a bus;
   a second substrate having first and second surfaces that are opposite to each other, the first surface facing a surface of the first substrate, the second substrate including:
      a first circuit in which a first switching element and a first resistor are connected in series between a first terminal and a second terminal, the first terminal connected to the first signal terminal, and
      a second circuit in which a second switching element and a second resistor are connected in series between a third terminal and a fourth terminal, the third terminal connected to the second signal terminal;
   a third substrate facing the second surface of the second substrate and including a first memory electrically connected to the second terminal;
   a fourth substrate facing the second surface of the second substrate and including a second memory electrically connected to the fourth terminal; and
   a controller electrically connected to the bus and configured to control the first and second switching elements.

2. The memory system according to claim 1, wherein the controller is configured to turn on the first switching element while turning off the second switching element when reading or writing data from or to the first memory.

3. The memory system according to claim 1, wherein the controller is configured to issue a selection signal to select one of the first and second memories for reading or writing operations, and
the first and second switching elements are turned on or off according to the selection signal.

4. The memory system according to claim 1, wherein the controller is disposed on the first substrate.

5. The memory system according to claim 1, wherein the first and second circuits are included in a semiconductor integrated circuit.

6. The memory system according to claim 5, wherein the second substrate is an interposer circuit, and
the semiconductor integrated circuit is mounted on the interposer circuit with a bump.

7. The memory system according to claim 5, wherein the semiconductor integrated circuit is disposed on one surface of the second substrate.

8. The memory system according to claim 7, wherein the semiconductor integrated circuit is disposed at a center of said one surface of the second substrate.

9. The memory system according to claim 5, further comprising:
a fifth substrate between the second substrate and at least one of the first and second memories, wherein
the semiconductor integrated circuit is disposed on one surface of the second substrate facing the fifth substrate.

10. The memory system according to claim 1, wherein the second terminal is connected to a command signal terminal or an address signal terminal of the first memory.

11. The memory system according to claim 1, wherein a storage capacity of the first memory is different from a storage capacity of the second memory.

12. The memory system according to claim 11, wherein the first memory has dual die package structure, and
the second memory has single die package structure.

13. A memory system comprising:
   a first substrate including a first signal terminal and a second signal terminal electrically connected to a bus;
   a second substrate facing one surface of the first substrate and including:
      a first circuit in which a first switching element and a first resistor are connected in series between a first terminal and a second terminal, the first terminal being connected to the first signal terminal, and
      a first memory having dual die package structure and electrically connected to the second terminal;
   a third substrate facing the other surface of the first substrate and including:
      a second circuit in which a second switching element and a second resistor are connected in series between a third terminal and a fourth terminal, the third terminal being connected to the second signal terminal, and
      a second memory having single die package structure and electrically connected to the fourth terminal; and
   a controller electrically connected to the bus and configured to control the first and second switching elements.

14. The memory system according to claim 13, wherein the first and second signal terminals are arranged adjacent to each other across the first substrate.

15. The memory system according to claim 1, wherein each of the first and second memories is a double-data-rate 4 (DDR4) memory.

16. The memory system according to claim 1, wherein each of the first and second memories is a synchronous dynamic random access memory (SDRAM).

17. The memory system according to claim 1, further comprising:
a non-volatile semiconductor memory.

18. A memory system comprising:
a first substrate having first and second surfaces that are opposite to each other and including a first signal terminal and a second signal terminal electrically connected to a bus;
a second substrate having third and fourth surfaces that are opposite to each other, the third surface facing one of the first and second surfaces of the first substrate, the second substrate including a first circuit in which a first switching element and a first resistor are connected in series between a first terminal and a second terminal, the first terminal connected to the first signal terminal;
a third substrate having fifth and sixth surfaces that are opposite to each other, the fifth surface facing one of the first and second surfaces of the first substrate, the third substrate including a second circuit in which a second switching element and a second resistor are connected in series between a third terminal and a fourth terminal, the third terminal connected to the second signal terminal;
a fourth substrate facing the fourth surface of the second substrate and including a first memory electrically connected to the second terminal;
a fifth substrate facing the sixth surface of the third substrate and including a second memory electrically connected to the fourth terminal; and
a controller electrically connected to the bus and configured to control the first and second switching elements.

19. The memory system according to claim 1, wherein
the first resistor is connected between the first terminal and the first switching element, and
the second resistor is connected between the third terminal and the second switching element.

20. The memory system according to claim 1, wherein
the first substrate further includes a selection signal terminal through which a selection signal for selecting a memory is output, and
the first circuit includes a fifth terminal connected to the selection signal terminal and a sixth terminal through which the selection signal is output to the first memory.

* * * * *